United States Patent
Lee et al.

(10) Patent No.: US 9,461,269 B2
(45) Date of Patent: Oct. 4, 2016

(54) ORGANIC LIGHT EMITTING DISPLAY AND METHOD OF FABRICATING THE SAME

(71) Applicant: LG DISPLAY CO., LTD., Seoul (KR)

(72) Inventors: JaeYoung Lee, Paju-Si (KR); JoonWon Park, Seoul (KR); Sangheun Lee, Seoul (KR); HaeRi Huh, Goyang-si (KR); HunHoe Heo, Daejeon (KR); Ji-Min Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/312,349

(22) Filed: Jun. 23, 2014

(65) Prior Publication Data

US 2015/0115235 A1 Apr. 30, 2015

(30) Foreign Application Priority Data

Oct. 29, 2013 (KR) ........................ 10-2013-0129417

(51) Int. Cl.
*H01L 51/52* (2006.01)
*H01L 27/32* (2006.01)

(52) U.S. Cl.
CPC ....... *H01L 51/5253* (2013.01); *H01L 27/3244* (2013.01); *H01L 51/524* (2013.01)

(58) Field of Classification Search
CPC ............. H01L 51/5253; H01L 51/524; H01L 27/3244
See application file for complete search history.

(56) References Cited

U.S. PATENT DOCUMENTS

| | | | |
|---|---|---|---|
| 9,178,179 B2 * | 11/2015 | Guo | ................... H01L 51/5268 |
| 2001/0008207 A1 * | 7/2001 | Ando et al. | ............... 204/192.28 |
| 2003/0146439 A1 * | 8/2003 | Yamazaki et al. | ............... 257/79 |
| 2006/0063351 A1 * | 3/2006 | Jain | ............................. 438/455 |
| 2008/0138624 A1 * | 6/2008 | Lewis et al. | .................. 428/412 |
| 2009/0278449 A1 | 11/2009 | Choi et al. | |
| 2011/0006327 A1 * | 1/2011 | Park et al. | ....................... 257/98 |
| 2011/0100458 A1 * | 5/2011 | Kang | ...................... B32B 15/08 136/259 |
| 2012/0313508 A1 * | 12/2012 | Son et al. | ...................... 313/504 |
| 2013/0161592 A1 * | 6/2013 | Lee et al. | ......................... 257/40 |
| 2013/0202782 A1 * | 8/2013 | Mandlik | ................ H05B 33/10 427/66 |
| 2014/0020627 A1 | 1/2014 | Kano et al. | |
| 2014/0183498 A1 * | 7/2014 | Dhar | ................... H01L 51/5253 257/40 |

FOREIGN PATENT DOCUMENTS

| | | |
|---|---|---|
| EP | 1 324 405 A2 | 7/2003 |
| JP | 2007-287557 A | 11/2007 |
| JP | 2011-18639 A | 1/2011 |
| JP | 2013-91858 A | 5/2013 |
| JP | 2013-187019 A | 9/2013 |
| WO | 2009/002892 A1 | 12/2008 |
| WO | WO 2013/140728 A1 | 9/2013 |

* cited by examiner

*Primary Examiner* — John P Dulka
(74) *Attorney, Agent, or Firm* — Birch, Stewart, Kolasch & Birch, LLP

(57) ABSTRACT

The present disclosure provides an organic light emitting display that may comprise: an organic light emitting device (OLED) including a first electrode, an organic layer including a light-emitting layer, and a second electrode, which are sequentially formed on a substrate having a Thin Film Transistor (TFT) formed on the substrate; and an upper encapsulation layer, which is formed of an aluminum oxide-based material, is formed in a single layer, and is disposed on the substrate on which the organic light emitting device (OLED) is formed, wherein a Water Vapor Transmission Rate (WVTR) of the upper encapsulation layer is smaller than or equal to $10^{-2}$ g/m$^2$/day.

18 Claims, 11 Drawing Sheets

ORGANIC LIGHT EMITTING DISPLAY AND METHOD OF FABRICATING THE SAME

CROSS-REFERENCE TO RELATED APPLICATION

This application claims priority from and the benefit of Korean Patent Application No. 10-2013-0129417, filed on Oct. 29, 2013, which is hereby incorporated by reference for all purposes as if fully set forth herein.

BACKGROUND OF THE INVENTION

1. Field of the Invention

The present invention relates to an organic light emitting display, and a method of manufacturing the same.

2. Description of the Related Art

An image display for displaying various types of information on a screen corresponds to a core technology in the age of information communication and is developing in the direction toward a thinner, lighter, portable, and higher-performance display. Accordingly, an organic light emitting display for displaying an image by controlling the quantity of light emitted from an organic light-emitting layer is in the spotlight as a flat display device capable of reducing the weight and the volume of the display, which correspond to shortcomings of a Cathode Ray Tube (CRT).

The organic light emitting display is a self-emission device using a thin light-emitting layer between electrodes and has an advantage in that it can be thinned like paper.

A typical organic light emitting display has a structure including a sub-pixel driving unit array and an organic light emitting any formed on a substrate, wherein a light emitted from organic light emitting devices of the organic light emitting array displays an image while passing through the substrate of a barrier layer.

An organic light emitting device is susceptible to both degradations by internal factors, such as degradation of an electrode and a light-emitting layer by oxygen and degradation by reaction between a light-emitting layer and interface, and degradations by external factors, such as external moisture, oxygen, ultraviolet rays, and manufacturing conditions. Especially, since the external oxygen and moisture have a fatal influence on the lifespan of the device, packaging of the organic light emitting display is very important.

As a method for the packaging, a method of sealing a substrate having organic light emitting devices formed thereon by a protective cap is used. In this method, a moisture absorbent is attached to an inner central portion of the protective cap before the protective cap is sealed, to absorb moisture that may exist in the protective cap.

Further, in order to prevent the moisture absorbent from dropping to an organic layer, a semi-permeable membrane is attached to a rear surface of the protective cap to allow passage of moisture and oxygen.

The above-described packaging method using a protective cap made of metal or glass to protect an organic layer of an organic light emitting device from oxygen or moisture requires use of an additional material, such as adhesive or moisture absorbent, which may increase the material cost. Further, formation of a protective cap may increase the volume and thickness of the organic light emitting display and makes it difficult to apply flexibility to the display since the protective cap is made of glass.

In order to address these problems, a method of encapsulation by forming a thin bather layer is tried as another method for packaging an organic light emitting display. In this method, a film formed by laminating a plurality of inorganic insulating films and organic insulating films in multiple layers is used as the barrier layer. The reason why the barrier layer is formed by a plurality of films is to block the permeation of moisture or oxygen from the outside.

However, a barrier layer formed by stacking a plurality of inorganic insulating films and organic insulating films in multiple layers as described above has a large thickness and may generate a crack to cause damage to a substrate at the time of bending when it is applied to recent flexible display devices, which results in a bad product.

SUMMARY OF THE INVENTION

In this background, an aspect of the present invention is to provide an organic light emitting display and a method of fabricating the same, which can minimize an upper encapsulation layer of a display device to reduce or prevent the occurrence of a crack at the time of bending, thereby reducing damage to a substrate.

In accordance with an aspect of the present invention, there is provided an organic light emitting display. The organic light emitting display may comprise: an organic light emitting device (OLED) including a first electrode, an organic layer including a light-emitting layer, and a second electrode, which are sequentially formed on a substrate having a Thin Film Transistor (TFT) formed on the substrate; and an upper encapsulation layer, which is formed of an aluminum oxide-based material, is formed in a single layer, and is disposed on the substrate on which the organic light emitting device (OLED) is formed, wherein a Water Vapor Transmission Rate (WVTR) of the upper encapsulation layer is smaller than or equal to 10-2 g/m2/day.

In one embodiment, the organic light emitting display may further comprise: an adhesive layer disposed on the upper encapsulation layer; and a barrier layer disposed on the adhesive layer and encapsulating the organic light emitting device (OLED).

In another embodiment, the upper encapsulation layer may have a thickness of 20 to 50 nm.

In further another embodiment, the upper encapsulation layer may comprise hydrogen atoms.

In further another embodiment, a content ratio of the hydrogen atoms to a total number of all atoms in the upper encapsulation layer may be smaller than or equal to 10 percents.

In further another embodiment, the upper encapsulation layer may have a radius of curvature smaller than or equal to 10 mm in bending.

In further another embodiment, a ratio between Al and O in the aluminum oxide-based material may be in a range from 1:1.4 to 1:1.6.

In further another embodiment, the organic light emitting display may further comprise a silicon-based inorganic layer formed on an upper surface or a lower surface of the upper encapsulation layer.

In further another embodiment, a sum of thickness of the silicon-based inorganic layer and the upper encapsulation layer may be 0.02 to 3 μm.

In further another embodiment, the bather layer may comprise an optically isotropic film or a phase difference film.

In further another embodiment, the organic light emitting display may further comprise an inorganic layer or an organic layer formed on an upper surface or a lower surface of the barrier layer.

In further another embodiment, the substrate may be formed of a polyimide-based material or a polycarbonate-based material.

In further another embodiment, the organic light emitting display may further comprise a lower encapsulation layer formed of at least one organic material selected from the group consisting of Polyethylene Naphthalate (PEN), Polyethylene Terephthalate (PET), polyethylene ether phthalate, polycarbonate, polyarylate, polyether imide, polyether sulfonate, polyimide, and polyacrylate on a lower surface of the substrate.

As described above, according to the present invention, an upper encapsulation layer of a display device can be minimized to reduce or prevent the occurrence of a crack at the time of bending, thereby reducing damage to a substrate.

Further, in another aspect, the present invention can reduce the processes and costs.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
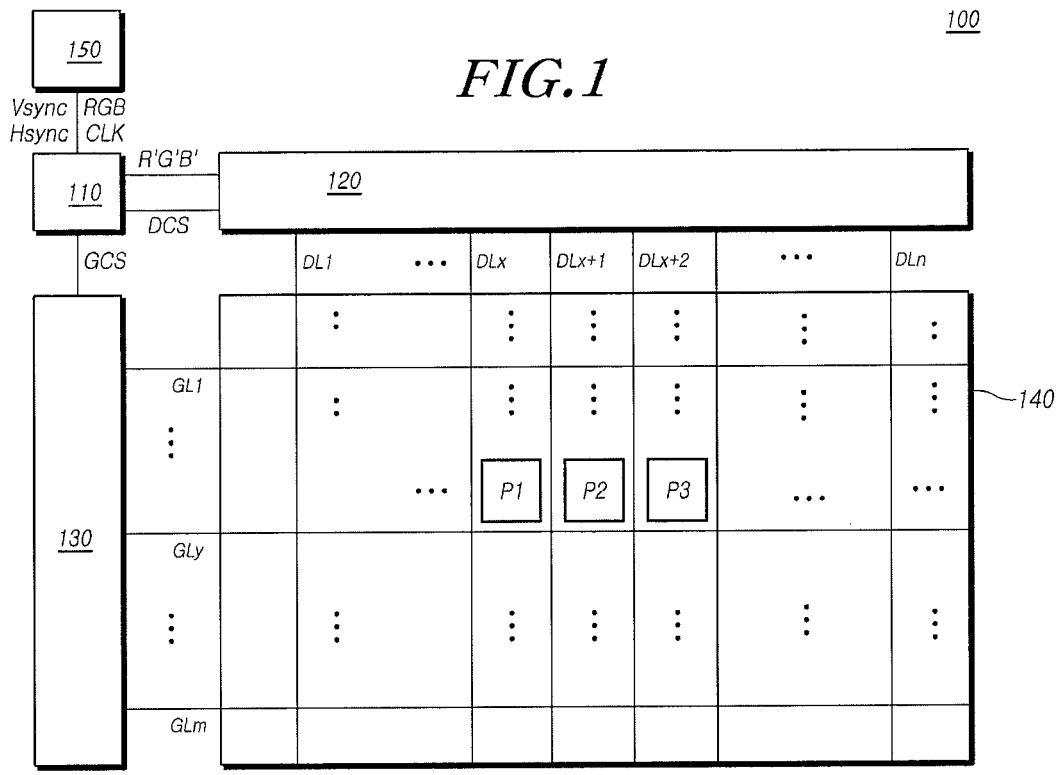
FIG. 1 illustrates a system configuration of an organic light emitting display to which embodiments of the present invention may be applied.

Hereinafter, exemplary embodiments of the present invention will be described with reference to the accompanying drawings. In the following description, the same elements will be designated by the same reference numerals although they are shown in different drawings. Further, in the following description of embodiments of the present invention, a detailed description of known functions and configurations incorporated herein will be omitted when it may make the main idea of the present invention unclear.

In the description of the elements of the present invention, terms "first", "second", "A", "B", "(a)", "(b)" and the like may be used. These terms are merely used to distinguish one element from another element, and do not limit a true nature, a sequence or an order of the corresponding element. In the case that it is described that a certain structural element "is connected to", "is coupled with", or "is in contact with" another structural element, it should be interpreted that another structural element may "be connected to", "be coupled with", or "be in contact with" other structural elements as well as that the certain structural element is directly connected to or is in direct contact with another structural element. Likewise, when it is described that a certain element is formed "on" or "under" another element, it should be understood that the certain element may be formed either directly or indirectly via a still another element on or under the another element.

FIG. 1 illustrates a system configuration of an organic light emitting display to which embodiments of the present invention may be applied.

Referring to FIG. 1, a display 100 for application of embodiments of the present invention includes a panel 140 having gate lines GL1 to GLn and data lines DL1 to DLm formed thereon and crossing each other, a gate driver 130 for driving the gate lines formed on the panel 140, a data driver 120 for driving the data lines formed on the panel 140, and a timing controller 110 for controlling driving timing of the gate driver 130 and the data driver 120. The timing controller 110 may receive signals, e.g. horizontal and vertical synchronization signals Hsync, Vsync, RGB data signals and a clock signal CLK, from a circuit 150.

On the panel 140, the gate lines GL1 to GLn and the data lines DL1 to DLm cross each other to define each Pixel (P).

The display 100 in FIG. 1 may be, for example, a Liquid Crystal Display (LCD), an Organic Light Emitting Device (OLED), or the like, and may be any type of display according to the embodiments described below. For example, the display 100 described above may be an organic light emitting display according to an embodiment described below or an organic light emitting display that can be manufactured by a method according to the embodiment described below.

Hereinafter, an organic light emitting display according to embodiments of the present invention will be described in more detail with reference to the accompanying drawings.

Figure 2:
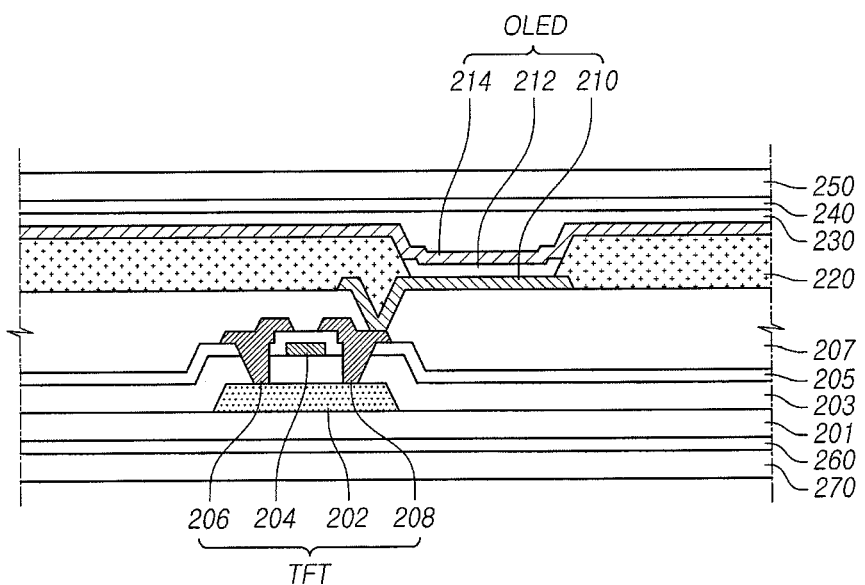
FIG. 2 is a sectional view of an organic light emitting display according to various embodiments of the present invention.

FIG. 2 is a sectional view of an organic light emitting display according to various embodiments of the present invention.

Referring to FIG. 2, an Organic Light Emitting Device (OLED) includes a first electrode 210, an organic light-emitting layer 212, and a second electrode 214 sequentially formed on a substrate 201 on which a Thin Film Transistor (TFT) is formed.

More specifically, a semiconductor layer 202, a gate insulating layer 203, a gate electrode 204, an inter-layer insulating layer 205, and source and drain electrodes 206 and 208 are sequentially formed on the substrate 201 to form the TFT, and a protective layer 207 is formed on the substrate 201 on which the TFT is formed.

In this event, the substrate 201 may be a plastic substrate 201 having a strong heat resistance. For example, the substrate 201 may be formed of a polyimide-based or polycarbonate-based material.

The semiconductor layer 202 may be formed of poly-silicon in accordance with an embodiment. In this case, a predetermined area of the semiconductor layer 202 may be doped with impurities.

Of course, the semiconductor layer 202 may be formed of amorphous silicon and may be formed of various organic semiconductor materials, such as pentacene, in accordance with other embodiments.

When the semiconductor layer 202 is formed of poly-silicon, the layer is first formed of amorphous silicon, which is then crystallized into poly-silicon. For the crystallization, various methods, such as a Rapid Thermal Annealing (RTA) process, a Metal Induced Lateral Crystallization (MILC) method, or a Sequential Lateral Solidification (SLS) method, may be employed.

The gate insulating layer 203 may be formed of an insulating material, such as silicon oxide (SiOx) or silicon nitride (SiNx). Of course, the gate insulating layer 203 may be formed of other insulating organic materials.

The gate electrode 204 may be formed of various conductive materials. For example, the gate electrode 204 may be formed of a metal or metal alloy, for example Mg, Al, Ni, Cr, Mo, W, MoW, Au, or an alloy thereof.

The inter-layer insulating layer 205 may be formed of an insulating material, for example an inorganic insulating material such as silicon oxide (SiOx) or silicon nitride (SiNx). Of course, the inter-layer insulating layer 205 may be formed of other insulating organic materials. The inter-layer insulating layer 205 and the gate insulating layer 203 may be selectively removed to form a contact hole through which source and drain areas are exposed.

The source and the drain electrode 206 and 208 are formed in a shape of a single layer or multiple layers on the inter-layer insulating layer 205 by burying a material for the gate electrode 204 in the contact hole.

The protective layer 207 protects and flattens the TFT. The protective layer 207 may be formed in various forms. Specifically, the protective layer 207 may be formed as an organic insulating layer, such as Benzocyclobutene (BCB) or Acryl, or an inorganic insulating layer, such as silicon nitride (SiNx) or silicon oxide (SiOx), may be formed in a single layer or multiple layers, or may be modified in various ways.

An Organic Light Emitting Device (OLED) includes a first electrode 210 formed on the protective layer 207, an organic layer 212 including a light-emitting layer formed on the first electrode 210, and a second electrode 214 formed on the organic layer 212.

More specifically, the first electrode 210 is electrically connected with the drain electrode 208 of the TFT through a contact hole. The first electrode 210 may be formed of an opaque conductive material having a high reflectance. For example, the first electrode 210 may be formed of a metal or metal alloy, for example Ag, Al, AlNd, Au, Mo, W, Cr, or an alloy thereof.

An area where light may be emitted, e.g. an area where the Organic Light Emitting Device (OLED) including the first electrode 210, the organic layer 212 and the second electrode 212 is formed, may be referred as light-emitting area.

A bank 220 is formed on the area other than the light-emitting area. Therefore, the bank 220 has a bank hole through which the first electrode 210 corresponding to the light-emitting area is exposed.

The bank 220 may be formed of an inorganic insulating material, such as silicon nitride (SiNx) or silicon oxide (SiOx), or an organic insulating material, such as BCB, acryl-based resin, or imide-based resin.

The organic layer 212 is formed on the first electrode 210 exposed through the bank 220. The organic layer 212 includes a light-emitting layer and may further include an electron injection layer, an electron transport layer, a hole transport layer, and a hole injection layer.

The second electrode 214 is formed on the substrate 201 on which the organic layer 212 is formed. The second electrode 214 is formed of a transparent conductive material, such as Indium Tin Oxide (ITO) or Indium Zinc Oxide (IZO), so as to emit light generated in the organic layer 212 upward of the second electrode 214 (in other words, to let light generated in the organic layer 212 pass through the second electrode 214 to be emitted at the top side of the display).

An upper encapsulation layer 230 attached to the second electrode 214 is formed on the substrate 201 on which the organic light emitting device (OLED) is formed. The upper encapsulation layer 230 is an inorganic monolayer. For example, the upper encapsulation layer 230 is an inorganic monolayer formed of an aluminum oxide. When the upper encapsulation layer 230 is formed of an aluminum oxide, in AlOx, the ratio between Al and O is in a range from 1:1.4 to 1:1.6. AlOx can be expressed as $Al_yO_z$. In this case, z/y is from 1.4 to 1.6, for example $Al_2O_3$.

The upper encapsulation layer 230 has a thickness of 20 to 50 nm. The upper encapsulation layer 230 having such a thickness can implement bending in a radius of curvature smaller than or equal to 10 mm.

The upper encapsulation layer 230 is formed by Atomic Layer Deposition (ALD). A thin layer formed by atomic layer deposition is formed at a speed of, e.g., about 5.4 nm/min and thus has an excellent uniformity and a high density. The upper encapsulation layer 230 formed by atomic layer deposition has a high density of 2.7 to 3.0 g/cm3 and an etch rate smaller than or equal to 70 nm/min. The upper encapsulation layer 230 has a Water Vapor Transmission Rate (WVTR) smaller than or equal to 10-2 g/m2/day. Therefore, the upper encapsulation layer 230 can prevent oxygen or moisture from permeating the substrate 201 from the outside to protect the substrate 201.

Further, the degree of stress of the upper encapsulation layer 230 is about ±100 Mpa, which prevents occurrence of a crack in the upper encapsulation layer 230 to thereby prevent damage to the substrate.

Further, the upper encapsulation layer 230 formed as described above has a surface roughness satisfying a range from 0.2 to 0.3 nm. Further, the upper encapsulation layer 230 has a refractive index in a range of 1.62 to 1.65 and a transmittance higher than or equal to 97% in a wavelength of 380 to 780 nm.

Meanwhile, the upper encapsulation 230 may comprise not only aluminum oxide-based material but also hydrogen Atoms.

In this case, a content ratio of the hydrogen atoms to a total number of all atoms in the upper encapsulation layer 230 may be smaller than or equal to 10 percents.

For example, the hydrogen atoms in the upper encapsulation layer 230 may be proton (hydrogen cation; H+) and/or hydride (Hydrogen Anion; H−) that combined with aluminum oxide-based material.

The hydrogen atoms in the upper encapsulation layer 230 can be impurities that degrade the performance of an encapsulation function (prevention of oxygen or moisture).

Therefore, the higher the content ratio of the hydrogen atoms in the upper encapsulation layer 230 becomes, the lower the performance of the encapsulation function becomes. In various embodiments of the present invention, because the upper encapsulation layer 230 is formed of an aluminum oxide-based material through Atomic Layer Deposition (ALD), the content ratio of the hydrogen atoms in the upper encapsulation layer 230 can be lowered further.

On the substrate 201 on which the upper encapsulation layer 230 is formed, a barrier layer 250 is disposed to encapsulate the substrate 201 including the organic light emitting device (OLED).

In this event, an adhesive layer 240 is formed between the upper encapsulation layer 230 and the bather layer 250. The adhesive layer 240 attaches the upper encapsulation layer 230 and the bather layer 250 to each other.

The adhesive layer 240 may be a thermally hardening or naturally hardening adhesive. For example, the adhesive layer 240 is formed of a material, such as Barrier pressure sensitive adhesive (B-PSA). It is recommended that the adhesive has a WVTR (Water Vapor Transmission Rate) smaller than or equal to 10-2 g/m2/day and a modulus (e.g. elastic modulus) of 0.3 MPa.

The bather layer 250 may be a phase difference film or an optically isotropic film.

When the bather layer 250 is a phase difference film, the bather layer 250 delays the phase of light emitted from the upper encapsulation layer 230 by 214. The phase difference film includes a poly carbonate-based film and has a phase difference of 138 to 148 nm.

Further, when the bather layer 250 is an optically isotropic film, the bather layer 250 has an optical isotropy in a range from 0 to 5 nm. As the optically isotropic film, a PolyCarbonate (PC)-based film, a Cyclic Olefin Copolymer (COC)-based film, and/or a Cyclic Olefin Polymer (COP)-based film may be used.

When the bather layer has an optical isotropy, the bather layer allows light incident to the barrier layer to pass through the bather layer without a phase delay.

Further, an organic layer or an inorganic layer may be further formed on an upper surface or a lower surface of the barrier layer. In this event, the inorganic layer may include a silicon oxide film (SiOx) or a silicon nitride film (SiNx).

The organic layer may include a polymer material, such as acryl-based resin, epoxy-based resin, polyimide, polyethylene, or the like. The organic layer or inorganic layer formed on an upper surface or lower surface of the bather layer blocks permeation of moisture or oxygen from the outside.

Meanwhile, a lower adhesive layer 260 and a lower encapsulation layer 270 are sequentially formed under the substrate 201. The lower encapsulation layer 270 may be formed of at least one organic material selected from the group consisting of Polyethylene Naphthalate (PEN), Polyethylene Terephthalate (PET), polyethylene ether phthalate, polycarbonate, polyarylate, polyether imide, polyether sulfonate, polyimide, and polyacrylate. The lower encapsulation layer 270 prevents permeation of moisture or oxygen into the substrate from the outside.

The lower adhesive layer 260 is formed of a thermally hardening or naturally hardening adhesive and attaches the substrate 201 and the lower encapsulation layer 270 to each other. For example, the lower adhesive layer 260 may be formed of a material, such as Optically Clear Adhesive (OCA). It is recommended that the adhesive has a WVTR smaller than or equal to 10-2 g/m2/day and a modulus (e.g. elastic modulus) of 0.3 Mpa.

Hereinafter, a method of fabricating an organic light emitting display according to various embodiments of the present invention will be described with reference to the drawings.

Figure 3A:
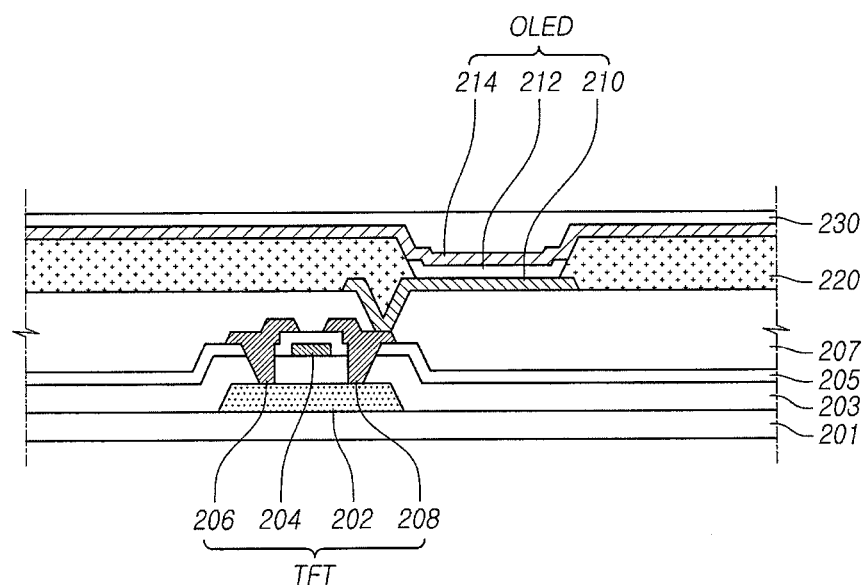
FIGS. 3A to 3C are sectional views illustrating a method of fabricating an organic light emitting display according to various embodiments of the present invention.
Figure 3B:
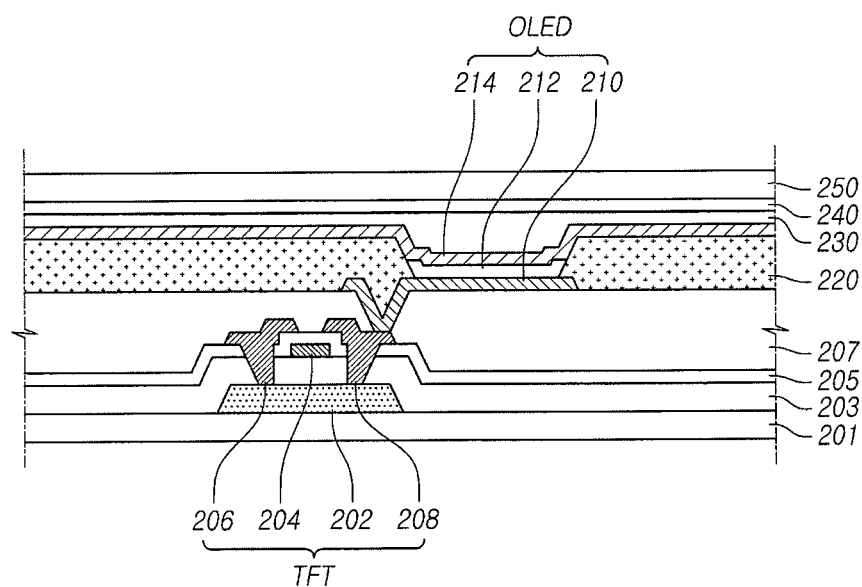
Figure 3C:
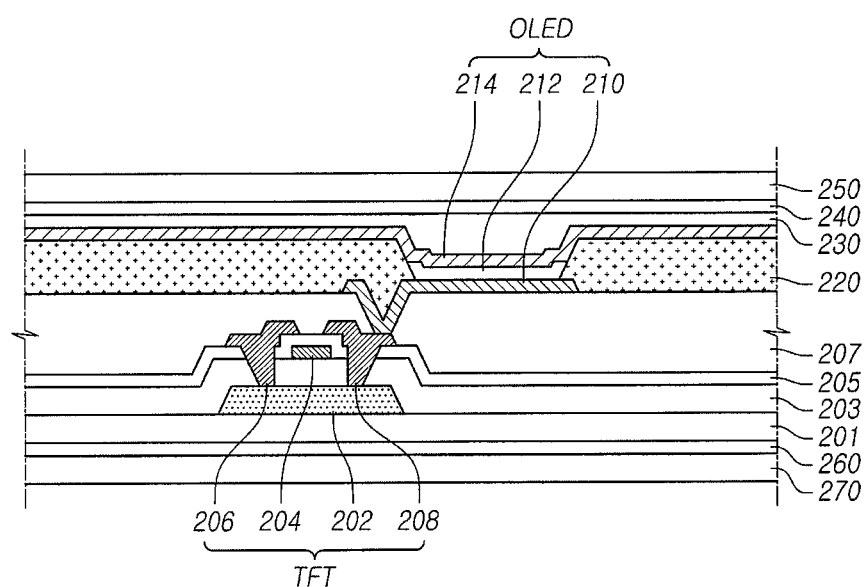

FIGS. 3A to 3C are sectional views illustrating a method of fabricating an organic light emitting display according to various embodiments of the present invention.

Referring to FIG. 3A, a substrate 201 is prepared and a TFT is then formed on the substrate 201.

In this event, the substrate 201 is formed of a plastic substrate having a strong heat resistance. For example, the substrate 201 may be formed of a polyimide-based or polycarbonate-based material.

The TFT is formed by sequentially forming a semiconductor layer 202, a gate insulating layer 203, a gate electrode 204, an inter-layer insulating layer 205, and source and drain electrodes 206 and 208 on the substrate 201. Thereafter, a protective layer 207 is formed on the entire surface of the substrate 201 provided with the TFT formed thereon.

The semiconductor layer 202 may be formed of polysilicon in accordance with an embodiment. In this case, a predetermined area of the semiconductor layer 202 may be doped with impurities. Of course, the semiconductor layer 202 may be formed of amorphous silicon and may be formed of various organic semiconductor materials, such as pentacene, in accordance with other embodiments.

When the semiconductor layer 202 is formed of polysilicon, the layer is first formed of amorphous silicon, which is then crystallized into poly-silicon. For the crystallization, various methods, such as a Rapid Thermal Annealing (RTA) process, a Metal Induced Lateral Crystallization (MILC) method, or a Sequential Lateral Solidification (SLS) method, may be employed.

The gate insulating layer 203 may be formed of an inorganic insulating material, such as silicon nitride (SiNx) or silicon oxide (SiOx), or an organic insulating material, such as BCB, acryl-based resin, or imide-based resin.

The gate electrode 204 may be formed of various conductive materials. For example, the gate electrode 204 may be formed of a metal or metal alloy, e.g. Mg, Al, Ni, Cr, Mo, W, MoW, Au, or an alloy thereof.

The inter-layer insulating layer 205 may be formed of an inorganic insulating material, such as silicon nitride (SiNx) or silicon oxide (SiOx), or an organic insulating material, such as BCB, acryl-based resin, or imide-based resin. The inter-layer insulating layer 205 and the gate insulating layer 203 may be selectively removed to form a contact hole through which source and drain areas are exposed.

The source and the drain electrode 206 and 208 are formed in a shape of a single layer or multiple layers on the inter-layer insulating layer 205 by burying a material for the gate electrode 204 in the contact hole. In this event, the source and drain electrodes are electrically connected with the semiconductor layer.

Then, a protective layer 207 is formed to protect and flatten the TFT. The protective layer 207 may be formed in various types and may be formed of an inorganic insulating material, such as silicon nitride (SiNx) or silicon oxide (SiOx), or an organic insulating material, such as BCB, acryl-based resin, or imide-based resin. Also, the protective layer 207 may be formed in various types, for example, may be formed in a single layer, double layers, or multiple layers.

Thereafter, a contact hole exposing a part of the drain electrode 208 is formed on in protective layer 207, and a first electrode 210 electrically connected with the drain electrode 208 of the TFT is formed through the contact hole.

The first electrode 210 may be formed of an opaque conductive material having a high reflectance. For example, the first electrode 210 may be formed of a metal or metal alloy, e.g. Ag, Al, AlNd, Au, Mo, W, Cr, or an alloy thereof.

Thereafter, a bank 220 is formed on the substrate 201. The bank 220 is formed on the area other than the light-emitting area. Then, the bank 220 exposes the first electrode 210 corresponding to the light-emitting area.

The bank 220 may be formed of an inorganic insulating material, such as silicon nitride (SiNx) or silicon oxide (SiOx), or an organic insulating material, such as BCB, acryl-based resin, or imide-based resin.

An organic layer 212 is formed on the first electrode 210 exposed through the bank 220. The organic layer 212 includes a light-emitting layer and may further include an electron injection layer, an electron transport layer, a hole transport layer, and a hole injection layer.

Thereafter, a second electrode 214 is formed on the entire surface of the substrate 201. The second electrode 214 is formed of a transparent conductive material, such as ITO, so as to emit light generated in the organic layer 212 upward of the second electrode 214. The second electrode 214 may be formed of a transparent conductive material, such as Indium Tin Oxide (ITO) or Indium Zinc Oxide (IZO).

As a result, an Organic Light Emitting Device (OLED) including a first electrode 210, an organic light-emitting layer 212, and a second electrode 214 sequentially formed on a substrate 210 having a Thin Film Transistor (TFT) formed thereon has been formed.

Thereafter, an upper encapsulation layer 230 is formed by atomic layer deposition on the substrate 201 including the organic light emitting device (OLED).

The upper encapsulation layer 230 is a monolayer formed of an inorganic material. For example, the upper encapsulation layer may be formed of an aluminum oxide (AlOx) or silicon (Si)-based material. When the upper encapsulation layer 230 is formed of an aluminum oxide, in AlOx, the ratio between Al and O is in a range from 1:1.4 to 1:1.6. AlOx can be expressed as $Al_yO_z$. In this case, z/y is from 1.4 to 1.6, for example $Al_2O_3$.

When the upper encapsulation layer 230 is formed by atomic layer deposition, it is possible to exactly and simply control the thickness of the upper encapsulation layer 230 while forming the upper encapsulation layer 230. For example, a uniform and high density thin layer can be formed using a solid precursor of the material for forming the upper encapsulation layer 230. It is impossible to form a high density thin layer by the Chemical Vapor Deposition (CVD). Further, use of the atomic layer deposition in forming a thin layer enables formation of the layer at a low temperature, which can minimize damage to the substrate. Therefore, a thin upper encapsulation layer can be formed by the atomic layer deposition.

The upper encapsulation layer 230 is formed by the atomic layer deposition to have a thickness of 20 to 50 nm. The reason why the upper encapsulation layer 230 is formed to have a thickness of 20 to 50 nm is that an upper encapsulation layer having a thickness smaller than 20 nm reduces the WVTR, which may allow oxygen or moisture permeating from the outside to damage the organic light emitting device. Further, when the upper encapsulation layer 230 is formed to have a thickness larger than 50 nm, the density or WVTR of the layer have no problem. However, stress applied at the time of bending may abruptly increase to generate one or more cracks in the upper encapsulation layer. When a crack is generated, moisture or oxygen from the outside may permeate through the crack to cause damage to the organic light emitting device, for example, pixels may shrink.

The upper encapsulation layer 230 formed by the atomic layer deposition as described above has a high density of 2.7 to 3.0 g/cm3 and an etch rate smaller than or equal to 70 nm/min, as noted through measurement.

Further, the upper encapsulation layer 230 has a WVTR of $5 \times 10^{-2}$ to $1 \times 10^{-4}$ g/m2/day, and more preferably, a WVTR smaller than or equal to $10^{-2}$ g/m2/day. The upper encapsulation layer 230 is located on the organic light emitting device and prevents permeation of moisture or oxygen into the substrate from the outside.

Further, the upper encapsulation layer 230 according to various embodiments of the present invention has a surface roughness satisfying a range from 0.2 to 0.3 nm, which implies a uniform thin layer. Further, the upper encapsulation layer 230 has a refractive index in a range of 1.62 to 1.65 and a transmittance higher than or equal to 97% in a wavelength of 380 to 780 nm.

Therefore, the upper encapsulation layer 230 according to various embodiments of the present invention can minimize the damage to the substrate through a simple process and can prevent oxygen or moisture from permeating the substrate 201 from the outside to protect the substrate 201.

Thereafter, referring to FIG. 3B, an adhesive layer 240 is formed on the upper encapsulation layer 230. The adhesive layer 240 may be formed of a thermally hardening or naturally hardening material. For example, the adhesive layer 240 may include an epoxy-based adhesive and may be formed of a material, such as Barrier Pressure Sensitive Adhesive (B-PSA). It is recommended that the adhesive has a WVTR smaller than or equal to $10^{-2}$ g/m2/day and a modulus (e.g. elastic modulus) of 0.3 Mpa.

Thereafter, a barrier layer 250 is formed on the adhesive layer 240. The barrier layer 250 encapsulates the organic light emitting device. The barrier layer 250 may be formed of a phase difference film or an optically isotropic film.

In one or more embodiments, the phase difference film has a central axis having an angle of 45 degrees with respect to a polarizing plate and delays the phase of light emitted from the upper encapsulation layer 230 by 214. The phase difference film includes a poly carbonate-based film and has a phase difference of 138 to 148 nm.

Further, when the barrier layer 250 is formed using an optically isotropic film, the barrier layer 250 has an optical isotropy in a range from 0 to 5 nm. As the optically isotropic film, a PolyCarbonate (PC)-based film, a Cyclic Olefin Copolymer (COC)-based film, and/or a Cyclic Olefin Polymer (COP)-based film may be used.

When the barrier layer 250 has an optical isotropy, the barrier layer allows light incident to the barrier layer to pass through the barrier layer without a phase delay.

Further, an organic layer or an inorganic layer may be further formed on an upper surface or a lower surface of the bather layer 250. In this event, the inorganic layer may include a silicon oxide film (SiOx) or a silicon nitride film (SiNx). The organic layer may be formed of a polymer material, such as acryl-based resin, epoxy-based resin, polyimide, polyethylene, or the like. The organic layer or inorganic layer formed on an upper surface or lower surface of the barrier layer blocks permeation of moisture or oxygen from the outside.

Thereafter, referring to FIG. 3C, a lower adhesive layer 260 and a lower encapsulation layer 270 are sequentially formed on a lower surface of the substrate 201 having the barrier layer 250 formed thereon.

The lower adhesive layer 260 is formed of a thermally hardening or naturally hardening adhesive and attaches the substrate 201 and the lower encapsulation layer 270 to each other. For example, the lower adhesive layer 260 may be formed of a material, such as Optically Clear Adhesive (OCA). It is recommended that the adhesive has a WVTR smaller than or equal to 10-2 g/m2/day and a modulus (e.g. elastic modulus) of 0.3 MPa.

The lower encapsulation layer 270 is attached to the lower surface of the substrate 201. The lower encapsulation layer 270 may be formed of Polyethylene Naphthalate (PEN), Polyethylene Terephthalate (PET), polyethylene ether phthalate, polycarbonate, polyarylate, polyether imide, polyether sulfonate, polyimide, polyacrylate, etc. The lower encapsulation layer 270 prevents permeation of moisture or oxygen into the substrate from the downside of the substrate. The lower encapsulation layer may be a mono-layer or a multi-layer.

FIGS. 4 to 8 and Table 1 show the measured performance of the upper encapsulation layer 230 of an organic light emitting display according to various embodiments with respect to the thickness thereof.

Figure 4:
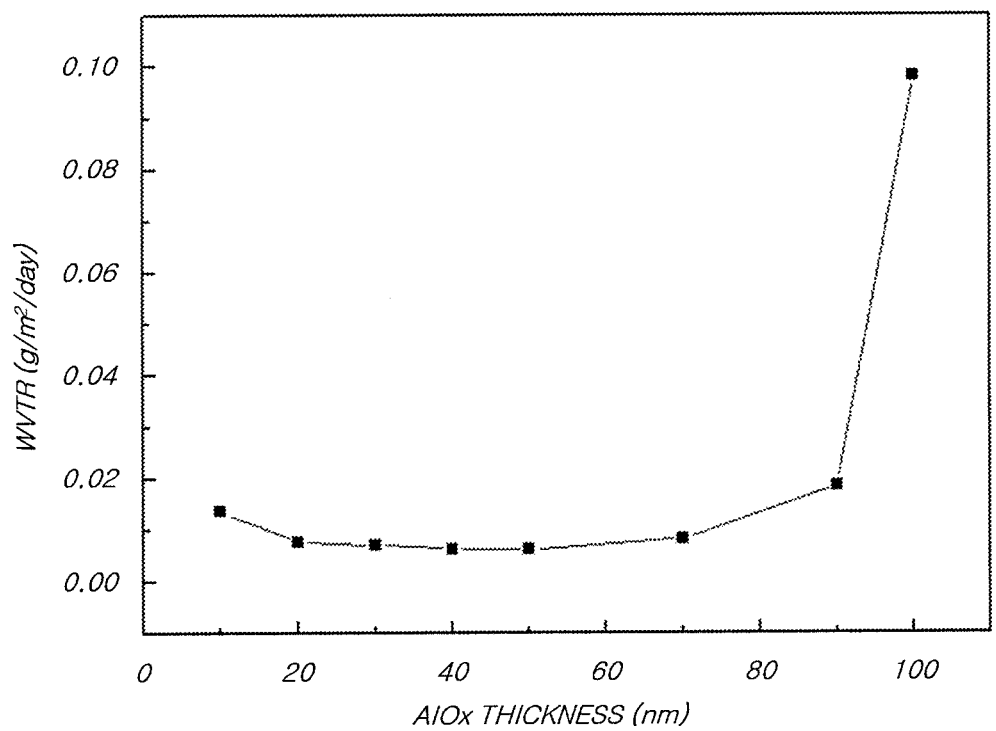
FIG. 4 is a graph illustrating a WVTR (Water Vapor Transmission Rate) of the upper encapsulation layer of an organic light emitting display according to various embodiments of the present invention with respect to the thickness thereof.

FIG. 4 is a graph illustrating a WVTR of the upper encapsulation layer 230 of the organic light emitting display according to various embodiments with respect to the thickness thereof.

Figure 5:
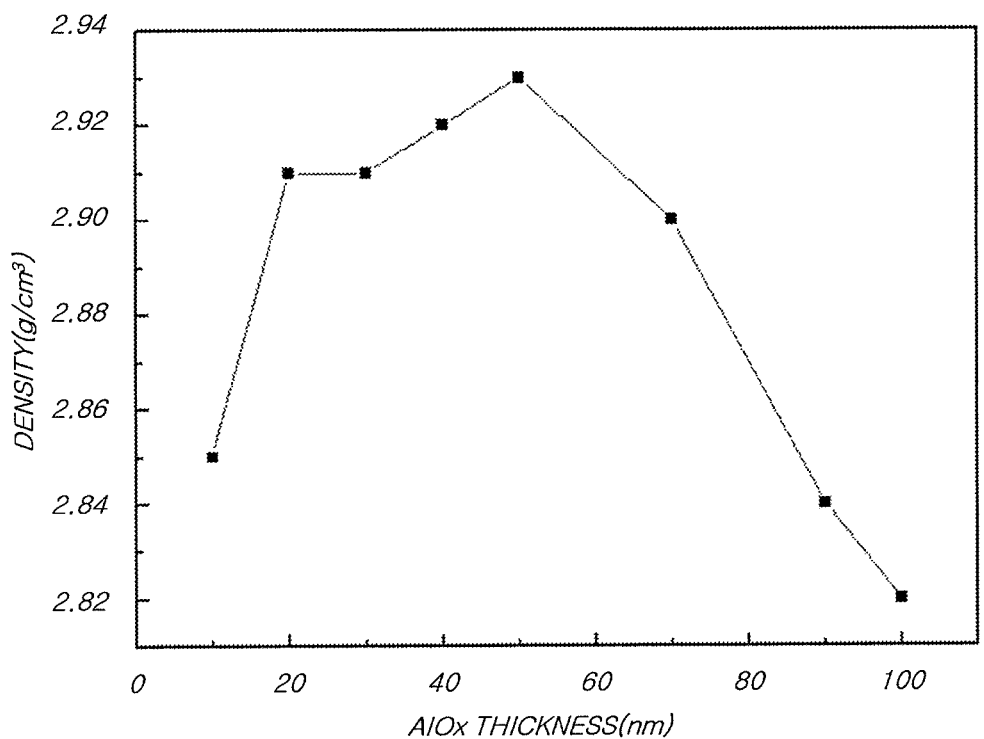
FIG. 5 is a graph illustrating a density of the upper encapsulation layer of an organic light emitting display according to various embodiments of the present invention with respect to the thickness thereof.

FIG. 5 is a graph illustrating a density of the upper encapsulation layer 230 of the organic light emitting display according to various embodiments with respect to the thickness thereof.

Figure 6:
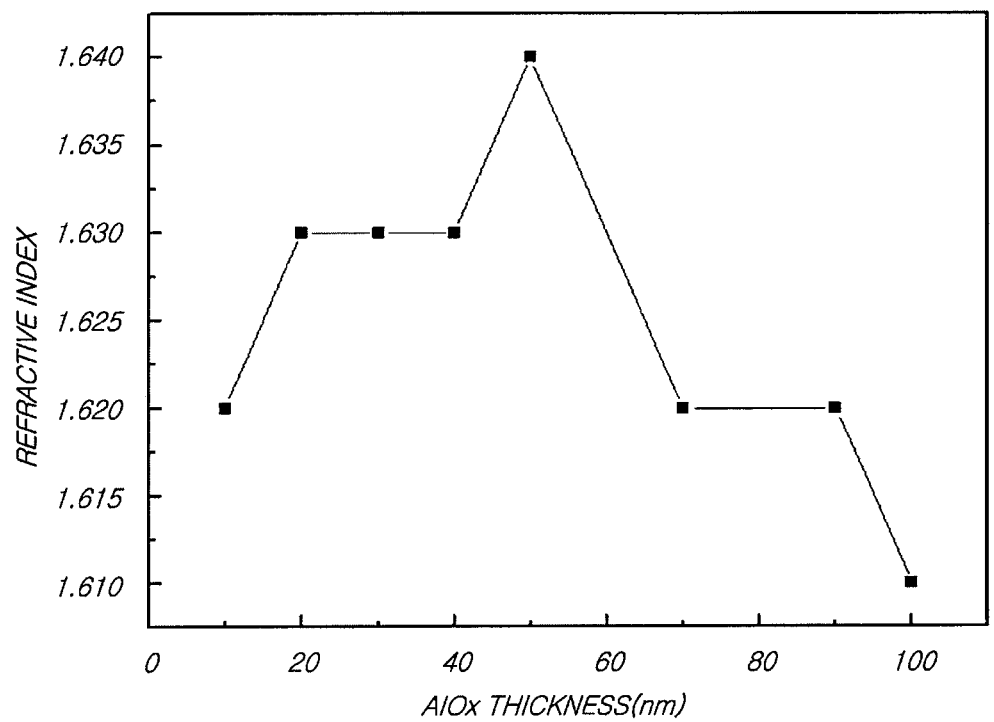
FIG. 6 is a graph illustrating a refractive index of the upper encapsulation layer of an organic light emitting display according to various embodiments of the present invention with respect to the thickness thereof.

FIG. 6 is a graph illustrating a refractive index of the upper encapsulation layer 230 of the organic light emitting display according to various embodiments with respect to the thickness thereof.

Figure 7:
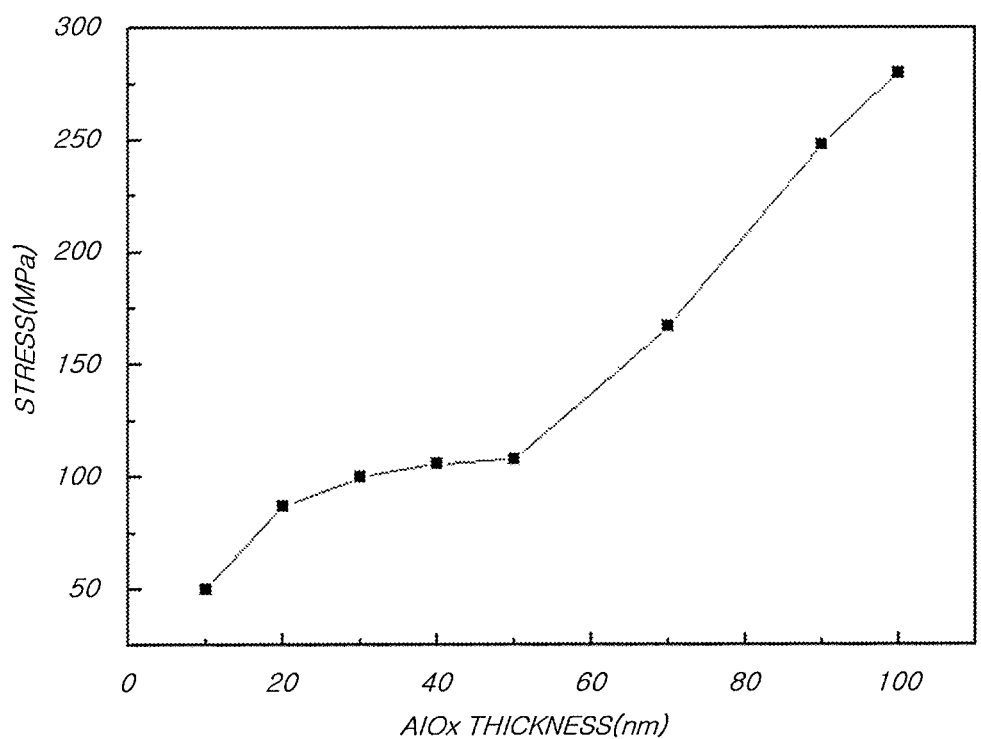
FIG. 7 is a graph illustrating stress of the upper encapsulation layer of an organic light emitting display according to various embodiments of the present invention with respect to the thickness thereof.

FIG. 7 is a graph illustrating stress of the upper encapsulation layer 230 of the organic light emitting display according to various embodiments with respect to the thickness thereof.

Figure 8:
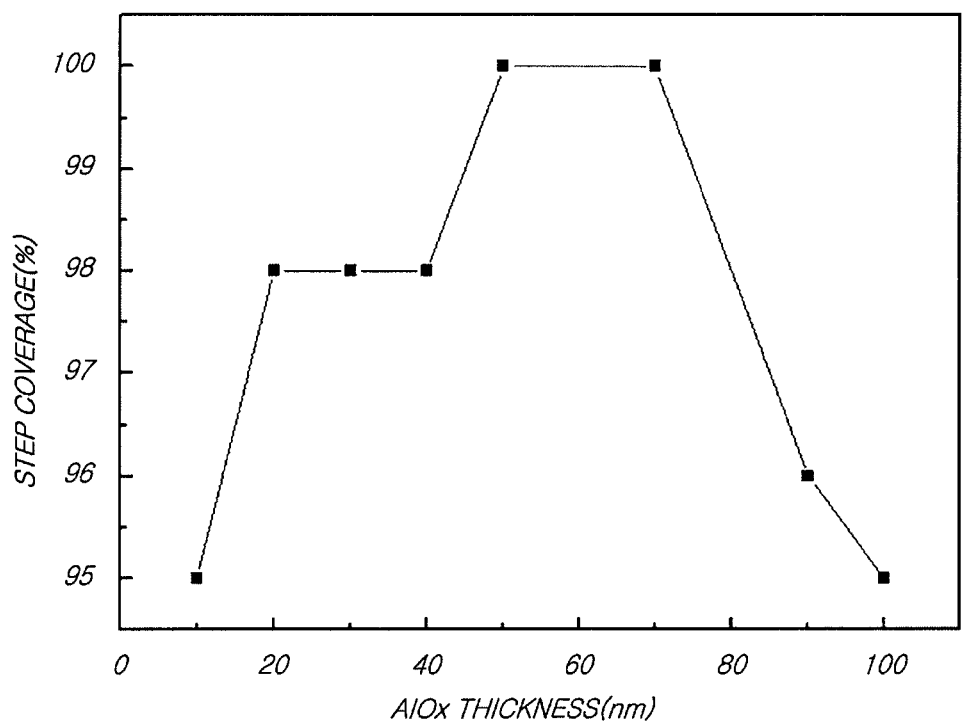
FIG. 8 is a graph illustrating a step coverage of the upper encapsulation layer 230 of an organic light emitting display according to various embodiments of the present invention with respect to the thickness thereof.

FIG. 8 is a graph illustrating a step coverage of the upper encapsulation layer 230 of the organic light emitting display according to various embodiments with respect to the thickness thereof.

Table 1 shows a WVTR, a density, a refractive index, stress, a step coverage of the upper encapsulation layer 230 of the organic light emitting display according to various embodiments with respect to the thickness thereof.

It is noted from FIGS. 4 to 8 and Table 1, the upper encapsulation layer 230 has stress of 108 MPa when it has a thickness of 50 nm and stress of 167 MPa, corresponding to an increase of about 50%, when it has a thickness of 70 nm. Further, it is noted that when the upper encapsulation layer 230 has a thickness of 90 nm, the stress has a value of 248 MPa, which shows a rapid increase. Therefore, when the upper encapsulation layer 230 is formed to have a thickness exceeding 50 nm, the likelihood of the occurrence of one or more cracks at the time of bending increases to thereby increase damage to the substrate. Further, the step coverage performance of the upper encapsulation layer 230 is reduced and the WVTR of the upper encapsulation layer 230 increases. As a result, a probability that the substrate may be damaged increases.

Further, when the upper encapsulation layer 230 has a thickness smaller than or equal to 20 nm, there is no big change in the density, refractive index, and step coverage. Further, since the stress is low, there is no big problem at the time of bending. However, when the upper encapsulation layer 230 has a thickness of 10 nm, the WVTR has a value of 0.013610-2 g/m2/day, which corresponds to about a double of the WVTR of 0.007810-2 g/m2/day when the upper encapsulation layer 230 has a thickness of 20 nm. Such an increase of the WVTR implies reduction of the function of protecting the substrate against permeation of moisture or oxygen from the outside. Further, when the upper encapsulation layer 230 has a thickness exceeding 50 nm, the density, refractive index, and step coverage are degraded to degrade the upper encapsulation layer 230.

The above mentioned step coverage means the extent to which substance are well-formed along step profile, while step portion is covered by the substance, as various layers or pattern are formed on substrate.

Further, since the upper encapsulation layer 230 formed in an aluminum oxide (AlOx) monolayer according to various embodiments is formed by the atomic layer deposition, it can be formed as a thin layer having a thickness of 20 to 50 nm. Further, the upper encapsulation layer 230 having a thickness of 20 to 50 nm can be used for a curved surface display without any problem since a crack does not occur in the layer even at the time of bending. Further, it is advantageous that the upper encapsulation layer 230 has a refractive index in a range of 1.63 to 1.64, which satisfies the standard thereof. Further, since the upper encapsulation layer 230 has a good density and a low WVTR in spite of its thin thickness, it can perform the function of protecting the OLED well.

Therefore, the upper encapsulation layer 230 according to various embodiments can reduce its thickness while improving the bending characteristic, in comparison with the conventional lamination of multiple organic/inorganic layers on an OLED having a thickness of hundreds of nanometers in

TABLE 1

| | Performance according to AlOx thickness | | | | | | | |
|---|---|---|---|---|---|---|---|---|
| | 10 nm | 20 nm | 30 nm | 40 nm | 50 nm | 70 nm | 90 nm | 100 nm |
| WVTR | 0.0136 | 0.0078 | 0.0072 | 0.0064 | 0.0062 | 0.0083 | 0.0185 | 0.098 |
| Density (g/cm$^3$) | 2.85 | 2.91 | 2.91 | 2.92 | 2.93 | 2.90 | 2.84 | 2.82 |
| Refractive index | 1.62 | 1.63 | 1.63 | 1.63 | 1.64 | 1.62 | 1.62 | 1.61 |
| Stress (MPa) | 50 | 87 | 100 | 106 | 108 | 167 | 248 | 280 |
| Step coverage (%) | 95 | 98 | 98 | 98 | 100 | 100 | 96 | 95 | order to minimize damage by oxygen and moisture permeating from the outside. As a result, it is possible to provide an organic light emitting display and a fabricating method thereof including an upper encapsulation layer 230 having a high density, an excellent WVTR, and a high performance.

Hereinafter, an organic light emitting display according to various embodiments described above and an organic light emitting display according to the related art will be additionally described with reference to FIGS. 9 and 10.

Figure 9:
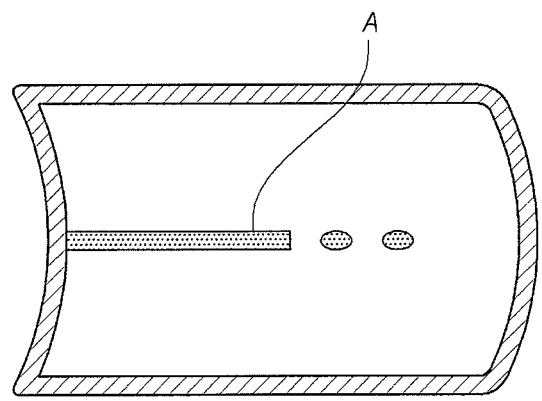
FIG. 9 is a photograph of an organic light emitting display according to the related art.

FIG. 9 is a photograph of an organic light emitting display according to the related art.

Figure 10:
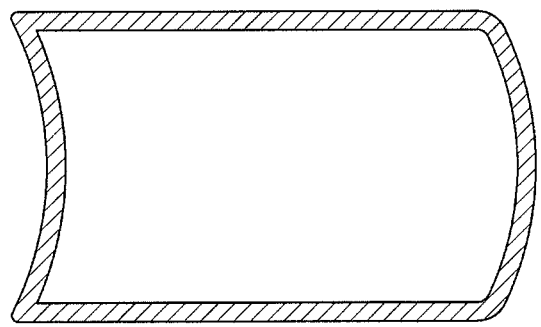
FIG. 10 is a photograph of an organic light emitting display according to various embodiments of the present invention.

FIG. 10 is a photograph of an organic light emitting display according to various embodiments.

Referring to FIG. 9, in the upper encapsulation layer formed to have a thickness of several scores μm by laminating silicon (Si)-based inorganic layers and epoxy and acryl-based organic layers in multiple layers according to the related art, a crack (A) is generated after bending, which allows permeation of moisture and/or oxygen from the outside so that pixel contraction occurs in the substrate.

In contrast, referring to FIG. 10, in an organic light emitting display having an upper encapsulation layer formed in a single layer of aluminum oxide (AlOx) according to various embodiments of the present invention, there is no generation of cracks and no damage of the substrate even after long term (e.g. about 240-500 hours) from the bending.

Therefore, an organic light emitting display according to various embodiments of the present invention can simplify the process in comparison with the related art, so as to improve the throughput, reduce the cost, and minimize occurrence of cracks at the time of bending.

Figure 11:
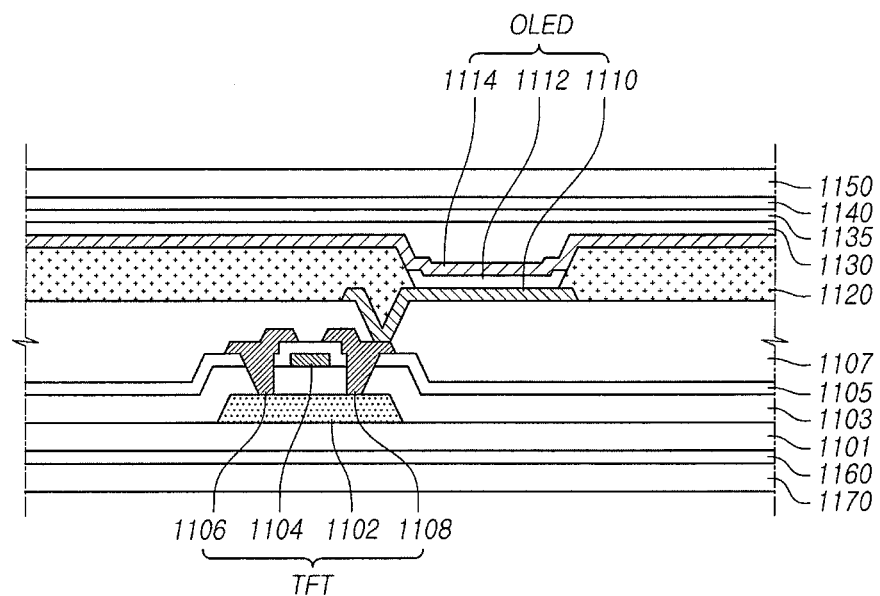
FIG. 11 is a sectional view of an organic light emitting display according to various embodiments of the present invention.

FIG. 11 is a sectional view of an organic light emitting display according to various embodiments of the present invention. The organic light emitting display shown in FIG. 11 is similar to the organic light emitting display shown in FIG. 2 except that a silicon (Si)-based inorganic layer is additionally formed on an upper encapsulation layer. Thus, repetitive descriptions will be omitted.

Referring to FIG. 11, a semiconductor layer 1102, a gate insulating layer 1103, a gate electrode 1104, an inter-layer insulating layer 1105, and source and drain electrodes 1106 and 1108 are sequentially formed on a substrate 1101 to form the TFT, and a protective layer 1107 is formed on the substrate 1101 on which the TFT is formed.

In this event, the substrate 1101 may be a plastic substrate having a strong heat resistance and may be formed of a polyimide-based material or a polycarbonate-based material.

An Organic Light Emitting Device (OLED) includes a first electrode 1110 formed on the protective layer 1107, an organic layer 1112 including a light-emitting layer formed on the first electrode 1110, and a second electrode 1114 formed on the organic layer 1112.

An upper encapsulation layer 1130, which is an inorganic monolayer consisting of aluminum oxide (AlOx), is formed on the Organic Light Emitting Device (OLED).

A silicon-based inorganic layer 1135 is formed on the upper encapsulation layer 1130. The silicon-based inorganic layer may be a silicon oxide film (SiOx) or a silicon nitride film (SiNx).

The upper encapsulation layer 1130 and the silicon-based inorganic layer 1135 are formed by atomic layer deposition.

The upper encapsulation layer 1130 has a thickness of 20 to 50 nm. When the upper encapsulation layer 1130 has a thickness exceeding 50 nm, its bending characteristic is degraded to allow permeation of moisture and oxygen to damage the substrate. When it has a thickness smaller than 20 nm, the WVTR decreases to thereby degrade the function of preventing permeation of moisture and oxygen into the substrate.

It is recommendable, in consideration of the bending characteristic, that the sum of thicknesses of the upper encapsulation layer 1130 and the silicon-based inorganic layer 1135 is 0.02 to 3 μm.

An adhesive layer 1140 and a barrier layer 1150 are sequentially formed on the silicon-based inorganic layer.

The adhesive layer 1140 may be a thermally hardening or naturally hardening adhesive and blocks moisture and oxygen introduced from the outside. For example, the adhesive layer 1140 may be formed of Barrier pressure sensitive adhesive (B-PSA). It is recommended that the adhesive has a WVTR smaller than or equal to 10-2 g/m2/day and a modulus (e.g. elastic modulus) of 0.3 MPa.

The barrier layer 1150 may include a phase difference film or an optically isotropic film.

Meanwhile, a lower adhesive layer 1160 and a lower encapsulation layer 1170 are sequentially formed under the substrate 1101. The lower adhesive layer 1160 and the lower encapsulation layer 1170 prevent permeation of moisture or oxygen into the substrate from the outside.

The lower adhesive layer 1160 may be a thermally hardening or naturally hardening adhesive. For example, the lower adhesive layer 1160 may be formed of a material, such as Optically Clear Adhesive (OCA). It is recommended that the adhesive has a WVTR smaller than or equal to 10-2 g/m2/day and a modulus of 0.3 MPa.

Figure 12A:
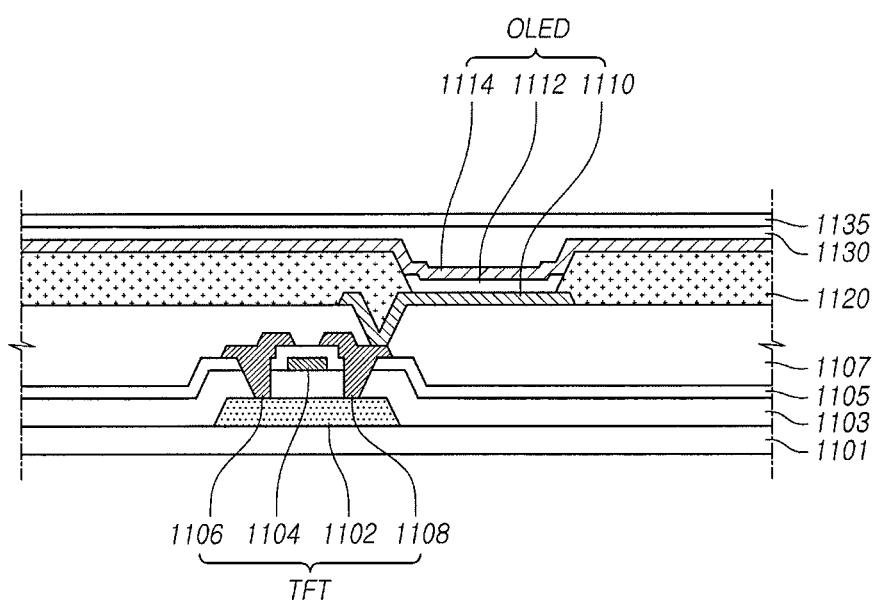
FIGS. 12A to 12C are sectional views illustrating a method of fabricating an organic light emitting display according to various embodiments of the present invention.
Figure 12B:
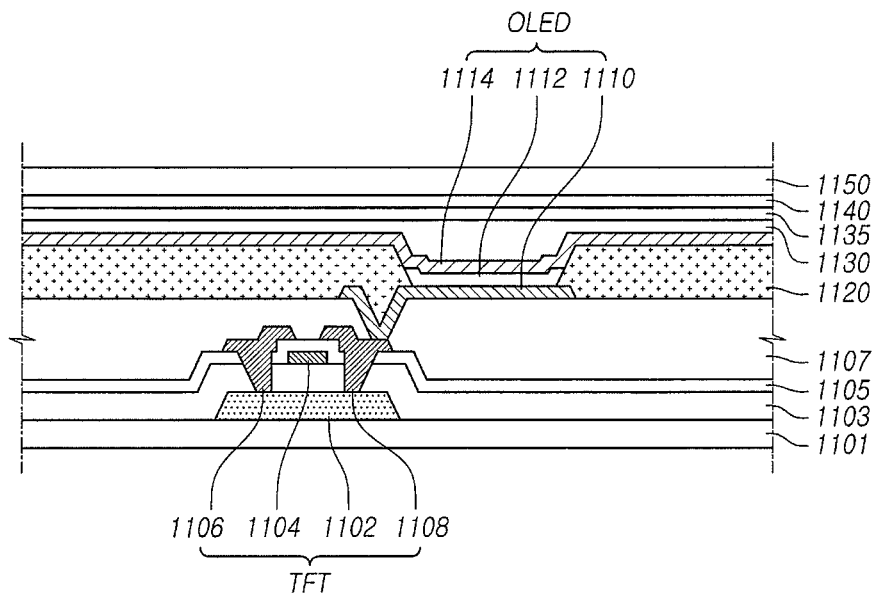
Figure 12C:
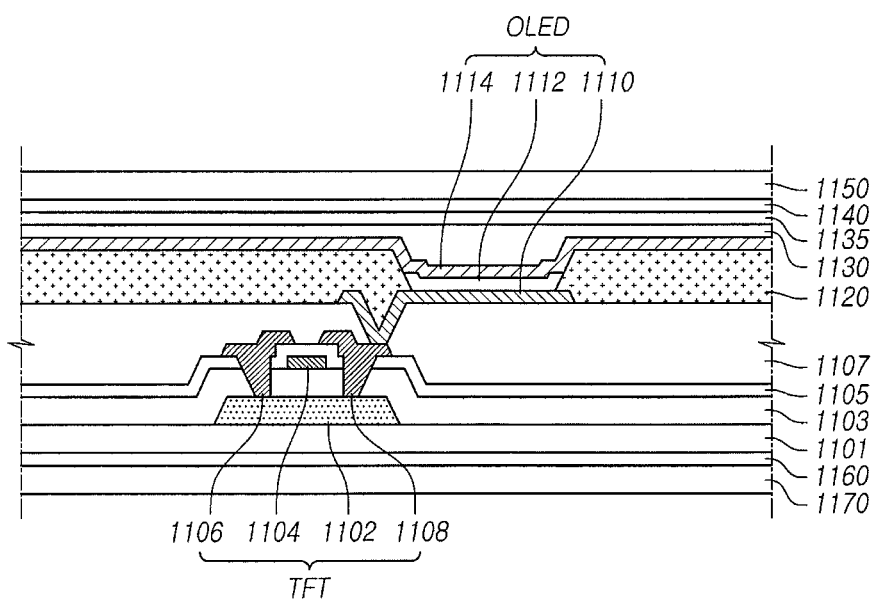

FIGS. 12A to 12C are sectional views illustrating a method of fabricating an organic light emitting display according to various embodiments of the present invention.

Referring to FIG. 12A, a substrate 1101 is formed of a plastic substrate having a strong heat resistance. For example, the substrate 1101 may be formed of a polyimide-based or polycarbonate-based material.

The TFT is formed by sequentially forming a semiconductor layer 1102, a gate insulating layer 1103, a gate electrode 1104, an inter-layer insulating layer 1105, and source and drain electrodes 1106 and 1108 on the substrate 1101. Thereafter, a protective layer 1107 is formed on the entire surface of the substrate 1101 provided with the TFT formed thereon.

Thereafter, a contact hole exposing a part of the drain electrode 1108 is formed in the protective layer 1107, and a first electrode 1110 electrically connected with the drain electrode 1108 of the TFT is formed through the contact hole.

Thereafter, a bank 1120 is formed on the substrate 1101. The bank 1120 is formed on the area other than the light-emitting area. Then, the bank 1120 exposes the first electrode 1110 corresponding to the light-emitting area.

Thereafter, an organic layer 1112 including a light-emitting layer is formed on the exposed first electrode 1110. The organic layer 1112 includes a light-emitting layer and may further include an electron injection layer, an electron transport layer, a hole transport layer, and a hole injection layer. Thereafter, a second electrode 1114 is formed on the entire surface of the substrate 1101.

As a result, an Organic Light Emitting Device (OLED) including the first electrode 1110, the organic light-emitting layer 1112, and the second electrode 1114 sequentially formed on the substrate 1101 having a Thin Film Transistor (TFT) formed thereon has been formed.

Thereafter, an upper encapsulation layer 1130 is formed by atomic layer deposition on the substrate 1101 including the organic light emitting device (OLED).

The upper encapsulation layer 1130 is an inorganic layer and is formed in a single layer by using aluminum oxide (AlOx). In this event, the ratio between Al and O in the aluminum oxide (AlOx) is in a range from 1:1.4 to 1:1.6. AlOx can be expressed as AlyOz. In this case, z/y is from 1.4 to 1.6, for example Al2O3.

When the upper encapsulation layer 1130 is formed by atomic layer deposition, it is possible to exactly and simply control the thickness of the upper encapsulation layer 1130 while forming the upper encapsulation layer 1130. For example, a uniform and high density thin layer can be formed using a solid precursor of the material for forming the upper encapsulation layer 1130. It is impossible to form a high density thin layer by the Chemical Vapor Deposition (CVD). Further, use of the atomic layer deposition in forming a thin layer enables formation of the layer at a low temperature, which can minimize damage to the substrate. Therefore, a thin upper encapsulation layer can be formed by the atomic layer deposition.

The upper encapsulation layer 1130 is formed by the atomic layer deposition to have a thickness of 20 to 50 nm. The reason why the upper encapsulation layer 1130 is formed to have a thickness of 20 to 50 nm is that an upper encapsulation layer having a thickness smaller than 20 nm reduces the WVTR, which may allow oxygen or moisture permeating from the outside to damage the organic light emitting device. Further, when the upper encapsulation layer 1130 is formed to have a thickness larger than 50 nm, the density or WVTR of the layer have no problem. However, stress applied at the time of bending may abruptly increase to generate one or more cracks in the upper encapsulation layer. When a crack is generated, moisture or oxygen from the outside may permeate through the crack to cause damage to the organic light emitting device, for example, pixels may shrink.

The upper encapsulation layer 1130 formed by the atomic layer deposition as described above has a high density of 2.7 to 3.0 g/cm3 and an etch rate smaller than or equal to 70 nm/min, as noted through measurement.

A silicon-based inorganic layer 1135 is formed on the upper encapsulation layer 1130. The silicon-based inorganic layer 1135 is also formed by atomic layer deposition.

The upper encapsulation layer 1130 and the silicon-based inorganic layer 1135 are formed so that that a sum of their thicknesses is in a range of 0.02 to 5 μm.

Thereafter, referring to FIG. 12B, an adhesive layer 1140 is formed on the silicon-based inorganic layer 1135. The adhesive layer 1140 may be formed of a thermally hardening or naturally hardening material. For example, the adhesive layer 1140 may be formed of Barrier pressure sensitive adhesive (B-PSA). It is recommended that the adhesive has a WVTR smaller than or equal to 10-2 g/m2-day and a modulus (e.g. elastic modulus) of 0.3 MPa.

Thereafter, a barrier layer 1150 is formed on the adhesive layer 1140. The barrier layer 1150 may be formed of a phase difference film or an optically isotropic film.

In one or more embodiments, the phase difference film has a central axis having an angle of 45 degrees with respect to a polarizing plate and delays the phase of light emitted from the upper encapsulation layer 1130 by 214. The phase difference film includes a poly carbonate-based film and has a phase difference of 138 to 148 nm.

Further, when the barrier layer 1150 is formed using an optically isotropic film, the barrier layer 250 has an optical isotropy in a range from 0 to 5 nm. As the optically isotropic film, a PolyCarbonate (PC)-based film, a Cyclic Olefin Copolymer (COC)-based film, and/or a Cyclic Olefin Polymer (COP)-based film may be used.

When the barrier layer 1150 has an optical isotropy, the barrier layer allows light incident to the barrier layer to pass through the barrier layer without a phase delay.

Also, an organic layer or an inorganic layer may be further formed on an upper surface or a lower surface of the barrier layer 1150. In this event, the inorganic layer may include a silicon oxide film (SiOx) or a silicon nitride film (SiNx). The organic layer may be formed of a polymer material, such as acryl-based resin, epoxy-based resin, polyimide, polyethylene, or the like. The organic layer or inorganic layer formed on an upper surface or lower surface of the barrier layer blocks permeation of moisture or oxygen from the outside.

Thereafter, referring to FIG. 12C, a lower adhesive layer 1160 and a lower encapsulation layer 1170 are sequentially formed on a lower surface of the substrate 1101 having the barrier layer 1150 formed thereon.

The lower adhesive layer 1160 is formed of a thermally hardening or naturally hardening adhesive and attaches the substrate 1101 and the lower encapsulation layer 1170 to each other. For example, the lower adhesive layer 1160 may be formed of a material, such as Optically Clear Adhesive (OCA).

The lower encapsulation layer 1170 is attached to the lower surface of the substrate 1101. The lower encapsulation layer 1170 may be formed of Polyethylene Naphthalate (PEN), Polyethylene Terephthalate (PET), polyethylene ether phthalate, polycarbonate, polyarylate, polyether imide, polyether sulfonate, polyimide, polyacrylate, etc. The lower encapsulation layer 1170 prevents permeation of moisture or oxygen into the substrate from the downside of the substrate. The lower encapsulation layer may be a mono-layer or a multi-layer.

Although various embodiments of the present invention are described above, the present invention is not limited to them.

In the embodiments described above, another layer, such as a polarizing layer, may be additionally formed on the barrier layer. In some embodiments, an additional layer formed of an organic material or an inorganic material may be formed between the upper encapsulation layer and the barrier layer.

Although a TFT or a top gate type TFT has been described in the above embodiments, the present invention may employ a bottom gate type TFT or various types of modified TFTs.

Although the light-emitting material of the light-emitting layer included in the organic layer is an organic material in the embodiments described above, a quantum dot, such as a graphene quantum dot, may be employed as the light-emitting material of the light-emitting layer. In a broad sense, a display/display device including a quantum dot as the light-emitting layer can be included in the organic light emitting display/display device in the present specification.

Further, the terms "includes", "constitutes", or "has" mentioned above mean that a corresponding structural element is included unless they have no reverse meaning. Accordingly, it should be interpreted that the terms may not exclude but further include other structural elements. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

While the technical spirit of the present invention has been exemplarily described, it will be understood by a person skilled in the art that the present invention may be changed and modified in various forms without departing from the scope of the present invention. Accordingly, the embodiments disclosed in the present invention are merely to not limit but describe the technical spirit of the present invention. Further, the scope of the technical spirit of the present invention is limited by the embodiments. The scope of the present invention should be interpreted by claims attached thereto, and it should be interpreted that all technical spirits within the scope equivalent to the claims pertains to the scope of the present invention.

What is claimed is:

1. An organic light emitting display comprising:
   an organic light emitting device (OLED) including a first electrode, an organic layer including a light-emitting layer, and a second electrode, which are sequentially on a substrate having a Thin Film Transistor (TFT) on the substrate, and having a light-emitting area that corresponds to the first electrode, the organic layer, and the second electrode;
   a bank disposed on the organic light emitting device on an area that is other than the light-emitting area, and having a bank hole that exposes the first electrode at the light-emitting area; and
   an upper encapsulation layer, which is formed of an aluminum oxide-based material, is formed in a single layer, is disposed on the substrate on which the organic light emitting device (OLED) is formed, and is directly contacting the second electrode of the OLED,
   wherein a water vapor transmission rate of the upper encapsulation layer is smaller than or equal to $10^{-2}$ g/m$^2$/day,
   wherein the upper encapsulation layer has a thickness of 20 to 50 nm, and
   wherein a density of the upper encapsulation layer ranges from 2.7 to 3.0 g/cm$^3$.

2. The organic light emitting display of claim 1, further comprising:
   an adhesive layer disposed on the upper encapsulation layer; and
   a barrier layer disposed on the adhesive layer and encapsulating the organic light emitting device (OLED).

3. The organic light emitting display of claim 2, wherein the barrier layer comprises an optically isotropic film or a phase difference film.

4. The organic light emitting display of claim 2, further comprising an inorganic layer or an organic layer on an upper surface or a lower surface of the barrier layer.

5. The organic light emitting display of claim 1, wherein the upper encapsulation layer comprises hydrogen atoms.

6. The organic light emitting display of claim 5, wherein a content ratio of the hydrogen atoms to a total number of all atoms in the upper encapsulation layer is smaller than or equal to 10 percent.

7. The organic light emitting display of claim 1, wherein the upper encapsulation layer has a radius of curvature smaller than or equal to 10 mm in bending.

8. The organic light emitting display of claim 1, wherein a ratio between Al and O in the aluminum oxide-based material is in a range from 1:1.4 to 1:1.6.

9. The organic light emitting display of claim 1, further comprising a silicon-based inorganic layer on an upper surface or a lower surface of the upper encapsulation layer.

10. The organic light emitting display of claim 9, wherein a sum of thickness of the silicon-based inorganic layer and the upper encapsulation layer is 0.02 to 3 μm.

11. The organic light emitting display of claim 1, wherein the substrate is formed of a polyimide-based material or a polycarbonate-based material.

12. The organic light emitting display of claim 11, further comprising a lower encapsulation layer formed of at least one organic material selected from the group consisting of Polyethylene Naphthalate (PEN), Polyethylene Terephthalate (PET), polyethylene ether phthalate, polycarbonate, polyarylate, polyether imide, polyether sulfonate, polyimide, and polyacrylate on a lower surface of the substrate.

13. The organic light emitting display of claim 1, wherein the bank is one of an inorganic insulation material and an organic insulation material.

14. The organic light emitting display of claim 13, wherein the inorganic insulation material includes one of silicon nitride and silicon oxide, and
   wherein the organic insulation material includes one of BCB, an acryl-based resin, and an imide-based resin.

15. An organic light emitting display comprising:
   an organic light emitting device (OLED) including a first electrode, an organic layer including a light-emitting layer, and a second electrode, which are sequentially on a substrate having a Thin Film Transistor (TFT) on the substrate, and having a light-emitting area that corresponds to the first electrode, the organic layer, and the second electrode;
   a bank disposed on the organic light emitting device on an area that is other than the light-emitting area, and having a bank hole that exposes the first electrode at the light-emitting area; and
   an upper encapsulation layer, which is formed of an aluminum oxide-based material, is formed in a single layer, is disposed on the substrate on which the organic light emitting device (OLED) is formed, and is directly contacting the second electrode of the OLED,
   wherein a water vapor transmission rate of the upper encapsulation layer is smaller than or equal to $10^{-2}$ g/m$^2$/day,
   wherein the upper encapsulation layer has a thickness of 20 to 50 nm,
   wherein the upper encapsulation layer has a first portion that corresponds to the light-emitting area and a second portion that corresponds to the area that is other than the light-emitting area, and
   wherein a thickness of the first portion of the upper encapsulation layer is greater than a thickness of the second portion of the upper encapsulation layer.

16. The organic light emitting display of claim 15, wherein the upper encapsulation layer comprises hydrogen atoms and a content ratio of the hydrogen atoms to a total number of all atoms in the upper encapsulation layer is smaller than or equal to 10 percent.

17. The organic light emitting display of claim 15, wherein the upper encapsulation layer has a radius of curvature smaller than or equal to 10 mm in bending.

18. The organic light emitting display of claim 15, wherein a ratio between Al and O in the aluminum oxide-based material is in a range from 1:1.4 to 1:1.6.

* * * * *